United States Patent
Lo

(10) Patent No.: US 8,625,281 B2
(45) Date of Patent: Jan. 7, 2014

(54) ELECTRONIC DEVICE WITH HEAT DISSIPATING ASSEMBLY

(75) Inventor: Wu-Jen Lo, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 226 days.

(21) Appl. No.: 13/314,187

(22) Filed: Dec. 8, 2011

(65) Prior Publication Data

US 2013/0077248 A1 Mar. 28, 2013

(30) Foreign Application Priority Data

Sep. 27, 2011 (TW) .................................. 100134896

(51) Int. Cl.
*H05K 7/20* (2006.01)
*F28F 7/00* (2006.01)

(52) U.S. Cl.
USPC ................. 361/704; 361/679.02; 361/679.46; 361/679.51; 361/679.54; 361/690; 361/692; 361/714; 165/80.2; 165/80.3; 165/104.33; 165/185; 174/50; 174/520; 312/223.2

(58) Field of Classification Search
USPC ............. 361/679.46–679.55, 679.01, 679.02, 361/690–697, 702–727; 165/80.2, 80.3, 165/80.4, 80.5, 104.33, 121–126, 185; 174/50, 50.02, 520; 312/223.2; 454/184

See application file for complete search history.

(56) References Cited

U.S. PATENT DOCUMENTS

| | | | | |
|---|---|---|---|---|
| 7,184,278 B2 * | 2/2007 | Tsai | ............................. | 361/816 |
| 7,889,493 B2 * | 2/2011 | Lee | ............................. | 361/679.4 |
| 7,995,341 B2 * | 8/2011 | Wu et al. | ....................... | 361/695 |
| 2005/0168942 A1 * | 8/2005 | Steinbrecher | ................ | 361/690 |
| 2010/0182748 A1 * | 7/2010 | Huang | ........................... | 361/690 |
| 2011/0043973 A1 * | 2/2011 | Tai | ........................... | 361/679.01 |

* cited by examiner

*Primary Examiner* — Michail V Datskovskiy
(74) *Attorney, Agent, or Firm* — Altis Law Group, Inc.

(57) ABSTRACT

An exemplary embodiment of an electronic device includes a cover including a first hole, and a heat dissipating assembly. The heat dissipating assembly includes a movable board including a second hole and slidably connected to the cover, and a heat magnifying device received inside the cover and adjacent to a heat element. The heat magnifying device includes a moving end secured with the movable board. When the heat element is maintained room temperature, the first hole and the second hole are staggered from each other to seal the cover. When heat generated by the heat element heats the heat magnifying device and causes the moving end of the heat magnifying device to move under thermal expansion and drive the movable board to slide relatively to the cover, and the first hole of the cover and the second hole of the movable board are communicated with each other.

14 Claims, 11 Drawing Sheets

US 8,625,281 B2

ELECTRONIC DEVICE WITH HEAT DISSIPATING ASSEMBLY

BACKGROUND

1. Technical Field

The present disclosure generally relates to electronic devices, and especially to a heat dissipating assembly of an electronic device.

2. Description of Related Art

Generally, a housing of an electronic device defines a plurality of holes to dissipate heat generated by electronic elements enclosed in the housing. However, the plurality of holes unavoidably provide an entrance for dust to go into the housing and cover the electronic elements. Over a long period of time, the dust would reduce heat dissipating performance of the electronic device and lead to the electronic device functioning abnormally.

Therefore, a need exists in the industry to overcome the described problems.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

Figure 1:
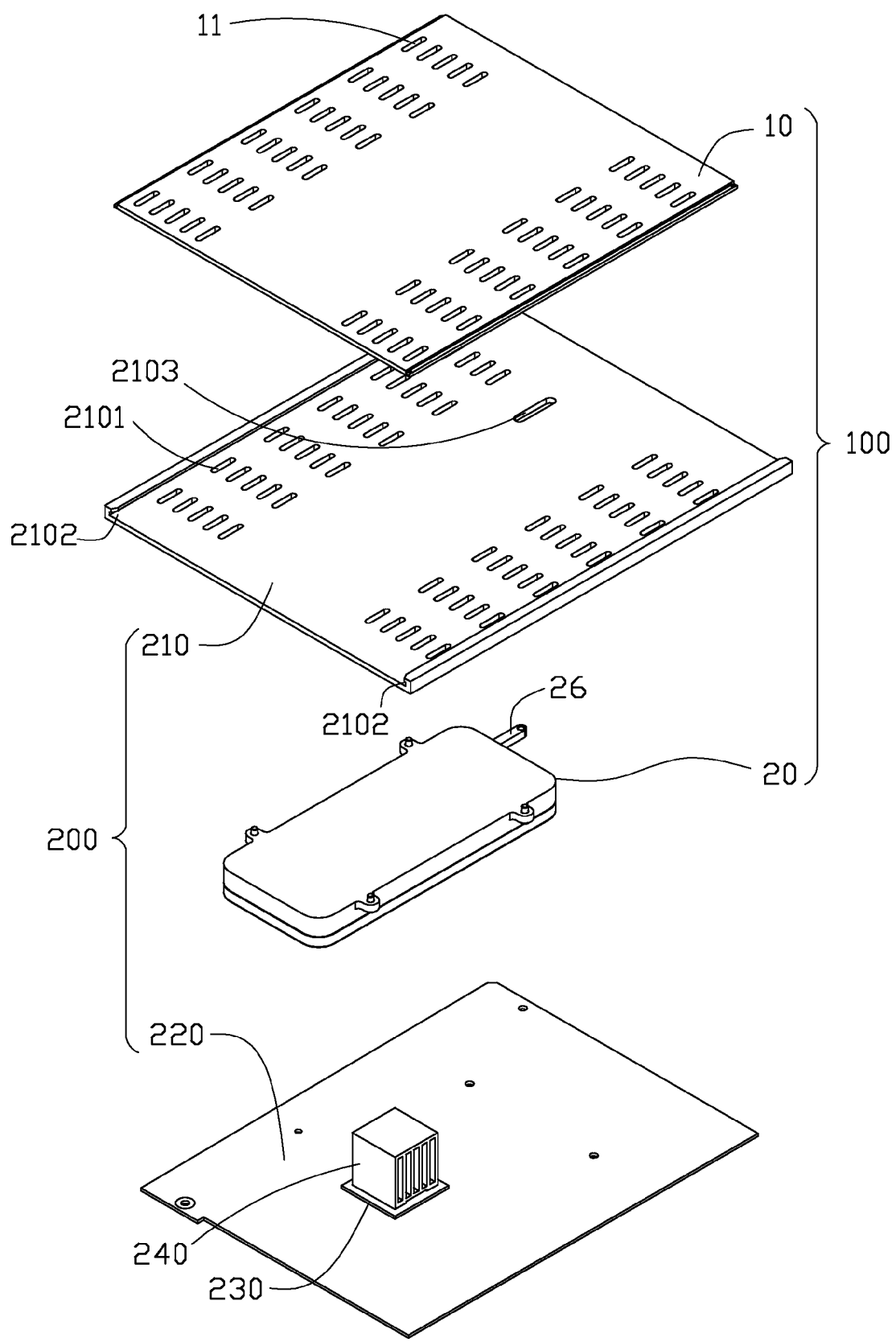
FIG. 1 is a disassembled view of an electronic device of an exemplary embodiment of the disclosure.

The disclosure is illustrated by way of example and not by way of limitation in the figures of the accompanying drawings, in which like reference numerals indicate similar elements. It should be noted that references to "an" or "one" embodiment in this disclosure are not necessarily to the same embodiment, and such references can mean "at least one" embodiment.

Figure 2:
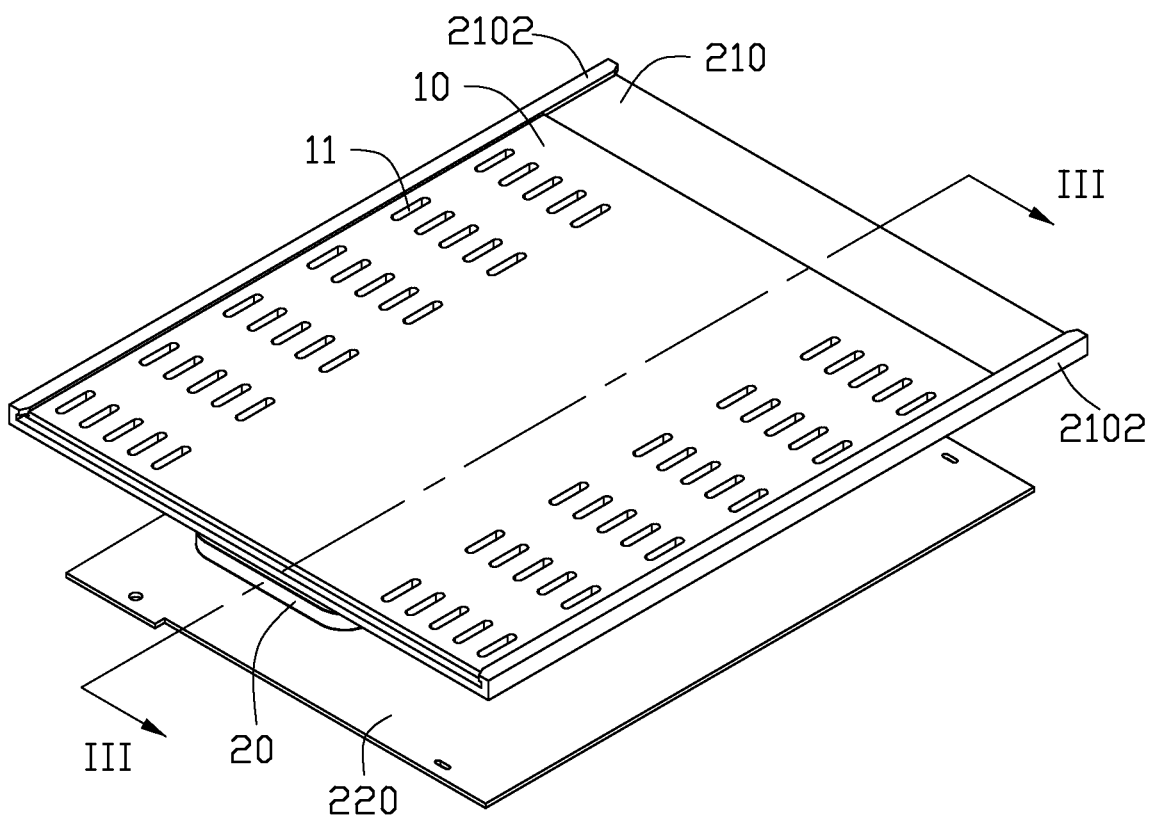
FIG. 2 is an assembled view of an exemplary embodiment of the electronic device of FIG. 1.
Figure 3:
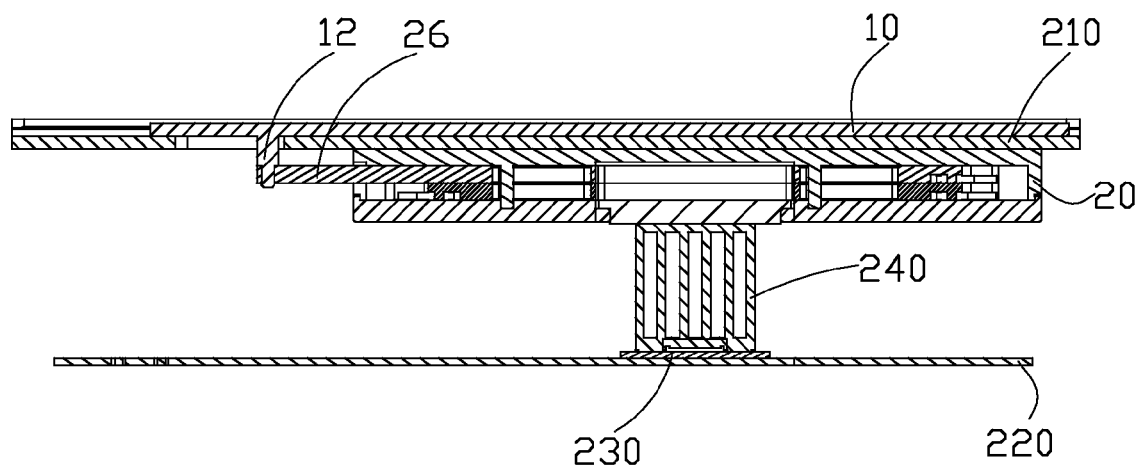
FIG. 3 is a cross sectional view taken along line III-III of FIG. 2.
Figure 4:
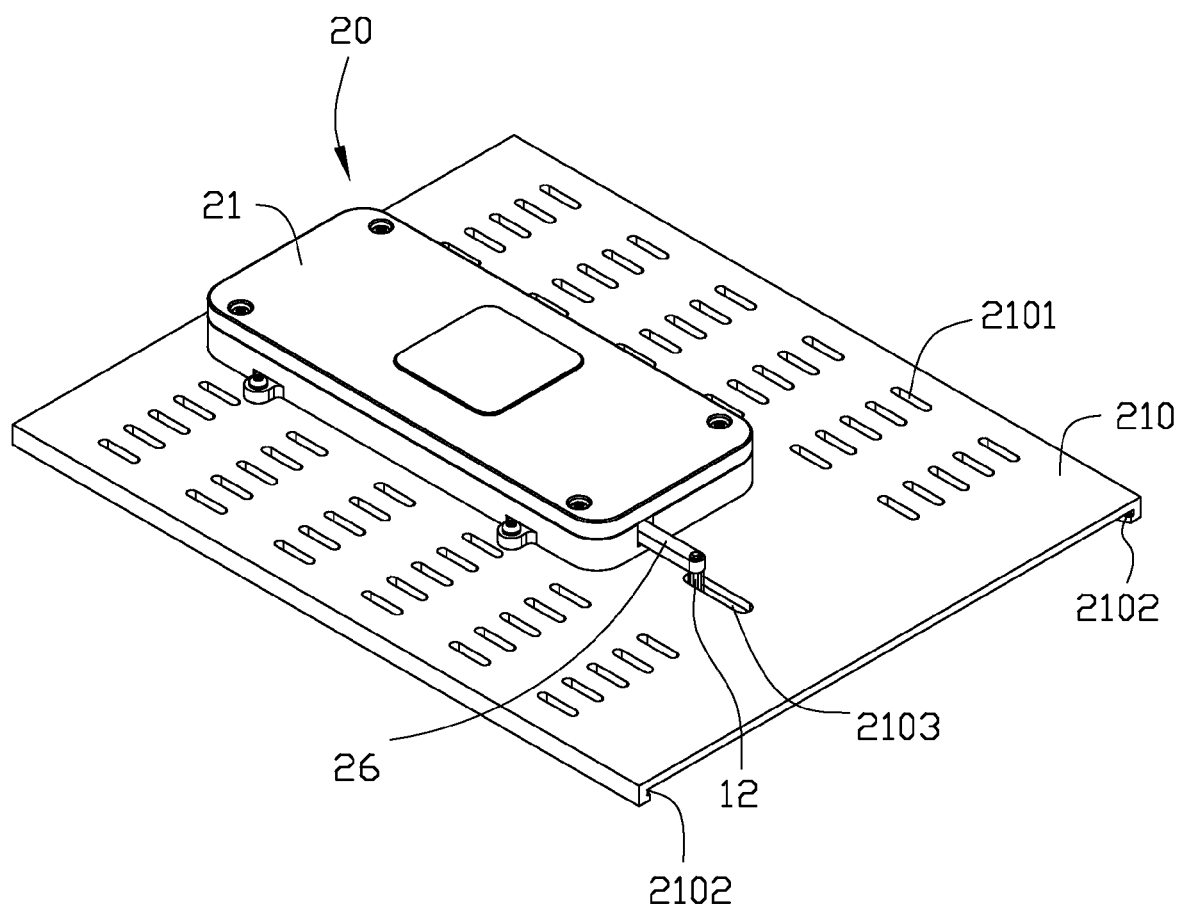
FIG. 4 is an assembled view of an exemplary embodiment of a heat dissipating assembly and a cover of the electronic device of FIG. 1.
Figure 5:
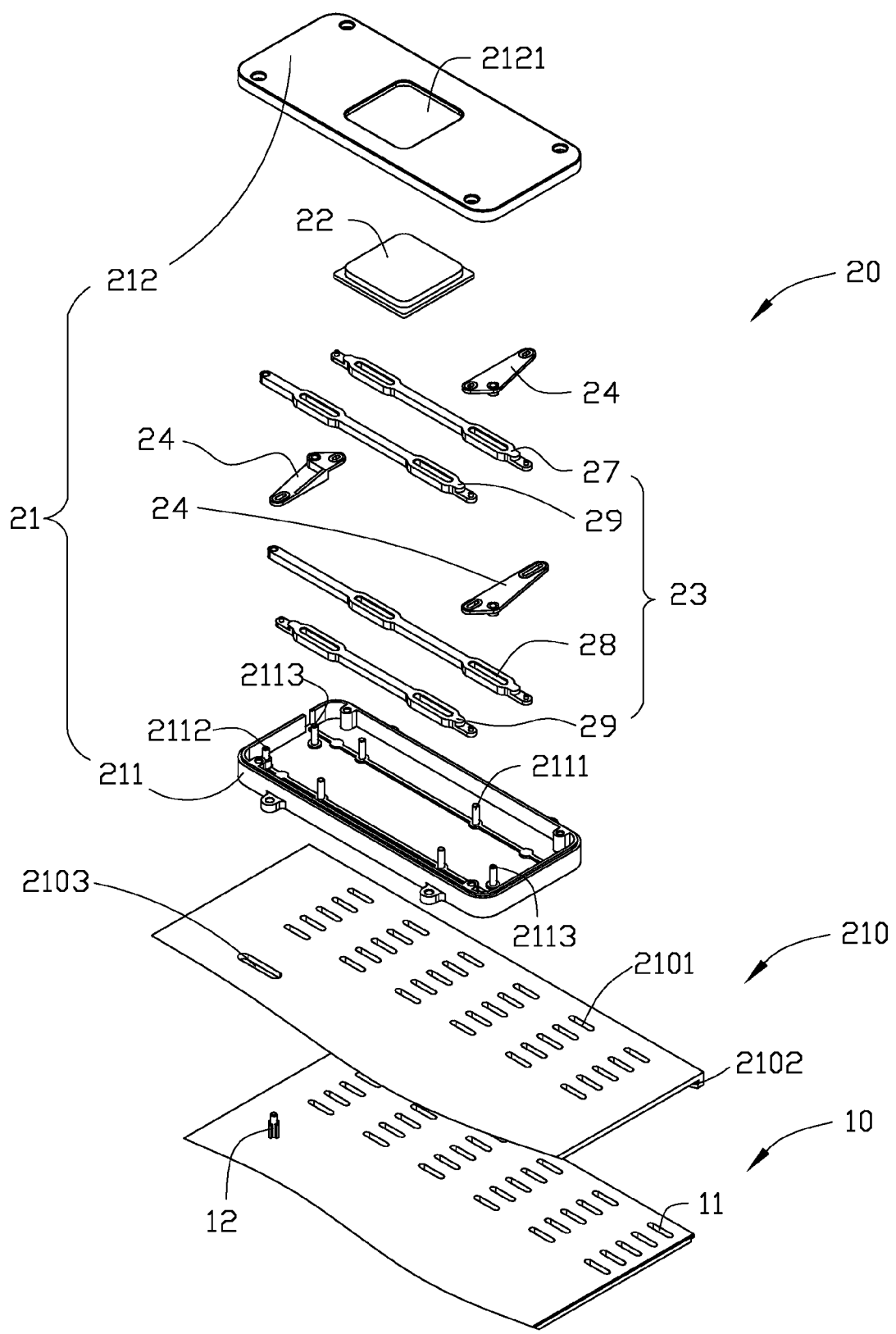
FIG. 5 is a disassembled view of FIG. 4.

With reference to FIGS. 1-3, an electronic device 200 comprises a cover 210 defining a plurality of first holes 2101, a printed circuit board (PCB) 220 received within the cover 210, a heat element 230 configured on the PCB 220, and a heat dissipating assembly 100 dissipating heat generated by the heat element 230 through the plurality of first holes 2101 of the cover 210. In the embodiment, the heat element 230 is a central processing unit (CPU).

Figure 6:
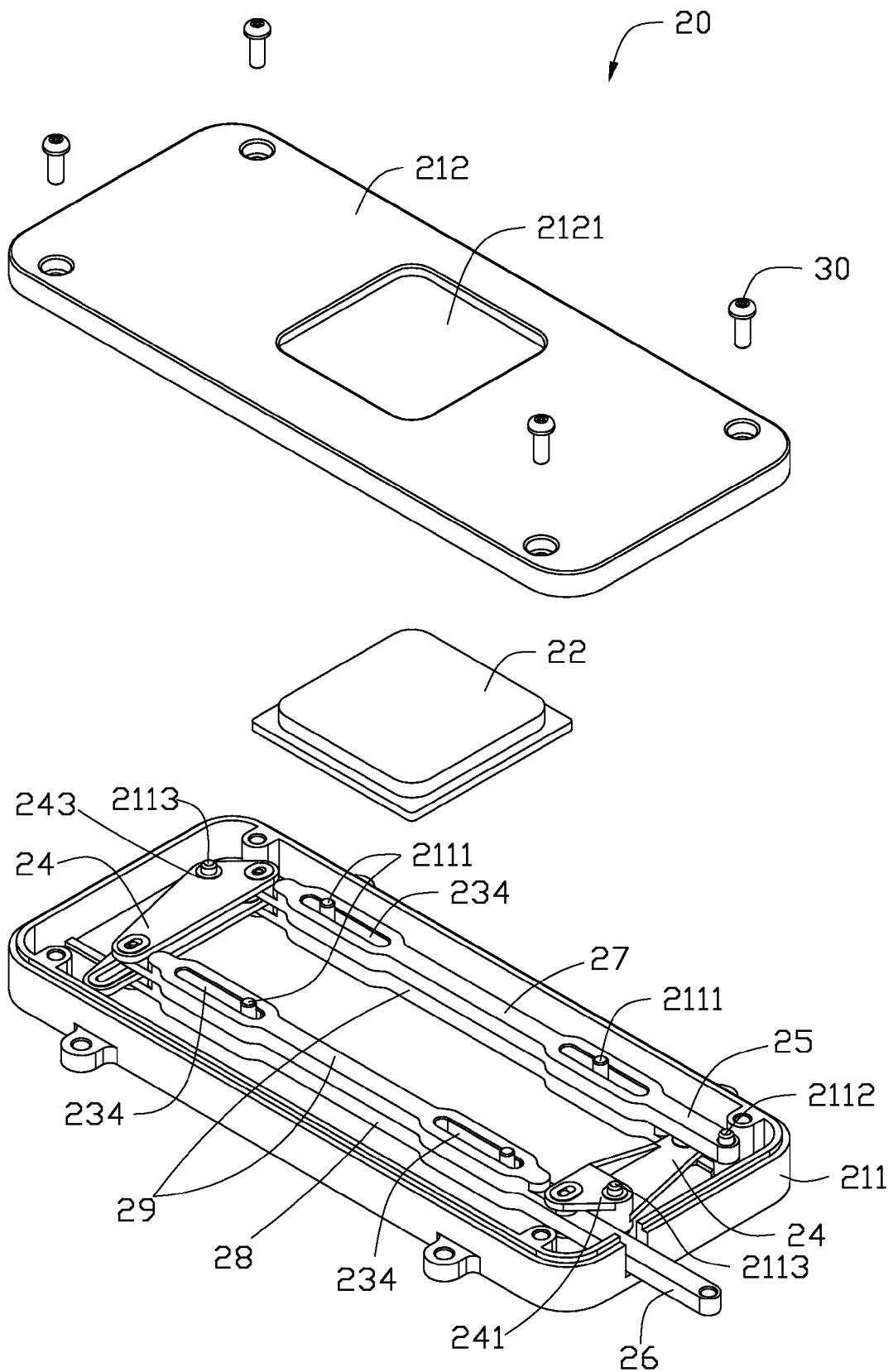
FIG. 6 is an exploded perspective view of an exemplary embodiment of a heat magnifying device of the heat dissipating assembly of FIG. 4.

The heat dissipating assembly 100 comprises a movable board 10 defining a plurality of second holes 11 and movably connected to the cover 210, and a heat magnifying device 20 configured within the cover 210 and adjacent to the heat element 230. The heat magnifying device 20 comprises a moving end 26 secured with the movable board 10, as shown in FIG. 6.

When the heat element 230 is maintained at room temperature, the moving end 26 of the heat magnifying device 20 is in an initial position, the plurality of first holes 2101 of the cover 210 and the plurality of second holes 11 of the movable board 10 are staggered from each other. As a result, the plurality of first holes 2101 of the cover 210 are blocked by the movable board 10, which prevents dust from entering into the cover 210, and enables the heat element 230 to have a good performance, due to the dust not covering the heat element 230.

When the heat element 230 works, heat generated by the heat element 230 is transmitted to the heat magnifying device 20 and heats the heat magnifying device 20, which leads to the moving end 26 of the heat magnifying device 20 to become elongated under the effects of thermal expansion. At the same time, the moving end 26 of the heat magnifying device 20 moves and drives the movable board 10 to slide relative to the cover 210. Subsequently, the first holes 2101 of the cover 210 and the second holes 11 of the movable board 10 are communicated with each other to dissipate the heat out of the cover 210.

In the embodiment, the electronic device 200 comprises a heat sink 240, and the heat magnifying device 20 abuts the heat sink 240.

In detail, the movable board 10 comprises a connecting post 12 projecting from the movable board 10, as shown in FIG. 3. The cover 210 defines a pair of sliding grooves 2102 and a through hole 2103. In assembly, the movable board 10 is located upon the cover 210, two sides of the board 10 are respectively received in the pair of sliding grooves 2102, and the connecting post 12 of the movable board 10 is inserted through the through hole 2103 to be secured with the moving end 26 of the heat magnifying device 20. With this structure, when the moving end 26 of the heat magnifying device 20 moves, the movable board 10 moves along the sliding grooves 2102 of the cover 210, at the same time, the connecting post 12 moves along the through hole 2103, which leads to the first holes 2101 of the cover 210 being opened or closed.

With reference to FIGS. 4-7, the heat magnifying device 20 comprises a case 21 secured to the cover 210, a thermal pad 22, a plurality of bars 23, and a plurality of connecting parts 24. The case 21 comprises a housing 211, and a lid 212 covering the housing 211 and defining a connecting hole 2121.

In the embodiment, the plurality of bars 23 comprises a primary bar 27, a terminal bar 28, and a plurality of secondary bars 29. Each of the plurality of bars 23 comprises a first end 231 and a second end 232. Each of the plurality of connecting parts 24 comprises a first positioning portion 241, a second positioning portion 242 and a pivoting portion 243 located between the first positioning portion 241 and the second positioning portion 242 and adjacent to the first positioning portion 241. In the embodiment, a thermal expansion coefficient of the bars 23 is higher than thermal coefficient of the case 21.

Figure 7:
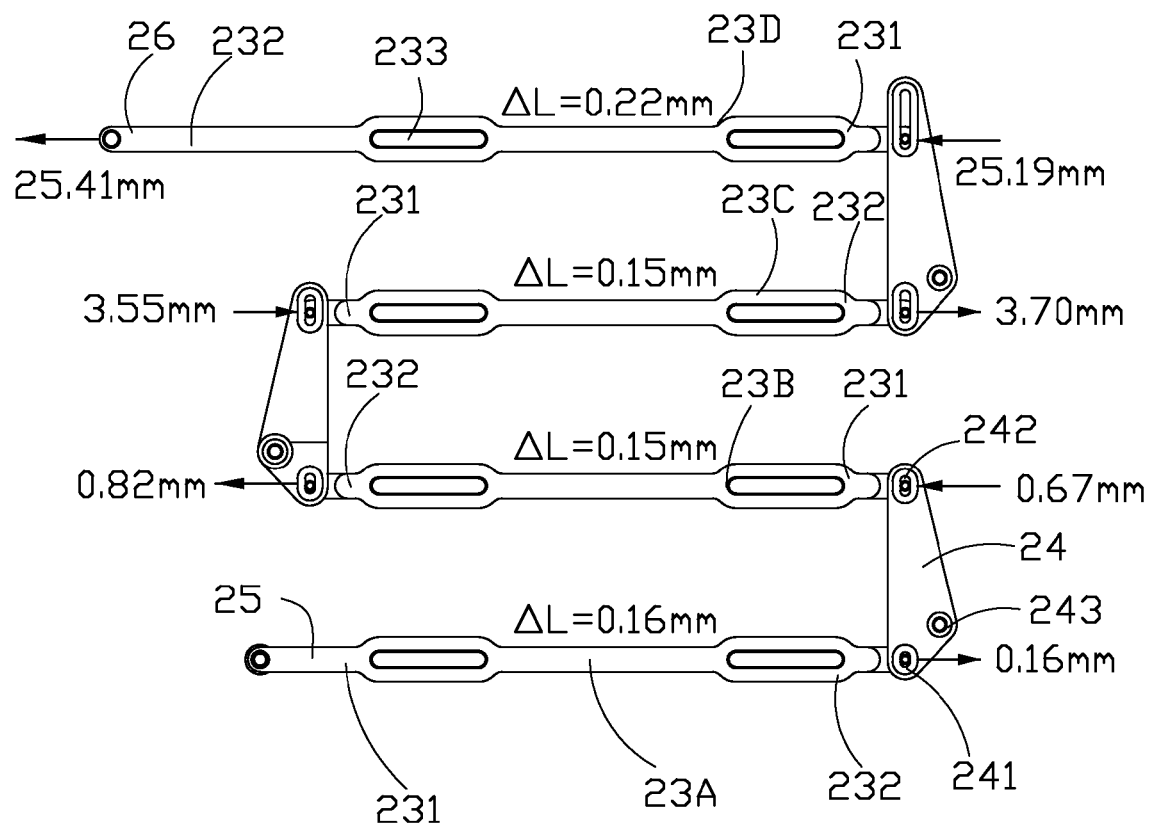
FIG. 7 is an unfolded view of a plurality of bars of the heat magnifying device of FIG. 6, showing a plurality of connecting parts linking the plurality of bars and an elongated size of each of the plurality of bars under effects of thermal expansion.

In assembly, each of the connecting parts 24 is connected between two neighboring bars 23. The first positioning portion 241 of each of the connecting parts 24 is movably connected to the second end 232 of a previous one of two adjacent bars 23 of the plurality of bars 23, and the second positioning portion 242 of the connecting part 24 is movably connected to the first end 231 of a next one of the two adjacent bars 23, as shown in FIG. 7. Subsequently, the linked plurality of bars 23 and connecting parts 24 are put in the housing 211 of the case 21, the first end 231 of the primary bar 27 is fixed with the housing 211, the second end 232 of the terminal bar 28 is exposed out of the housing 211 and formed as the moving end 26 of the heat magnifying device 20, and the pivoting portion 243 of each of the plurality of connecting parts 24 is pivotally connected to the housing 211 of the case 21. The lid 212 covers the housing 211, and the thermal pad 22 is received in the connection hole 2121 of the lid 212 with two opposite sides of the thermal pad 22 respectively adjacent to the plurality of bars 23 and the heat sink 240.

With reference to FIG. 7, with this structure, each of the plurality bars 23 elongates along the second end 232 of the bar 23, because the first end 231 of the primary bar 27 is fixed with the housing 211 of the case 21. Further, a length between the first end 231 of each of bars 23 and the pivoting portion 243 of a corresponding connecting part 24 is greater than that between the second end 231 of the bar 23 and the pivoting portion 243 of the corresponding connecting part 24. As a result, when each of the bars 23 is heated and elongates along the second end 232 of the bar 23, a corresponding connecting part 24 is subsequently driven to rotate around the pivoting portion 243 of the connecting part 24 and gradually magnify a displacement of the second end 232 of the bar 23. That is, thermal expansion of the plurality of bars 23 is changed and magnified to the extent that the displacement of the moving end 26 could drive the movable board 10 to slide relative to the cover 210.

In the embodiment, the plurality of bars 23 are stacked in the housing 211, and each layer of the stacked bars 23 comprises a pair of parallel bars 23, as shown in FIG. 6. This enables the heat generated by the heat element 230 to be focusably transmitted to the plurality of bars 23, and the plurality of bars 23 are heated completely. As a result, the moving end 26 of the heat magnifying device 20 can be movably displaced to drive the movable board 10 to slide.

With reference to FIG. 6 and FIG. 7, each of the plurality of bars 23 defines at least one positioning hole 233, and the at least one positioning holes 233 of the stacked bars 23 are communicated with each other to form a sliding groove 234. The housing 211 of the case 21 comprises at least one positioning posts 2111 projecting from a bottom of the housing 211. In assembly, the at least one positioning posts 2111 is received in the sliding groove 234 and capable of sliding along the sliding groove 234.

Figure 8:
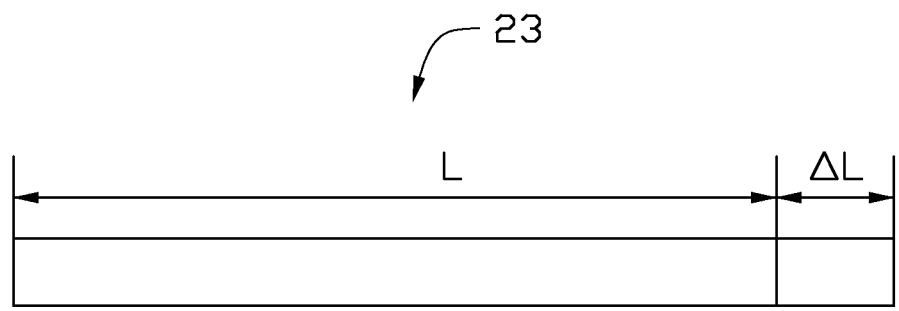
FIG. 8 is a schematic diagram of each of the plurality of bars of FIG. 7, showing the bar elongated under the effects of thermal expansion.
Figure 9:
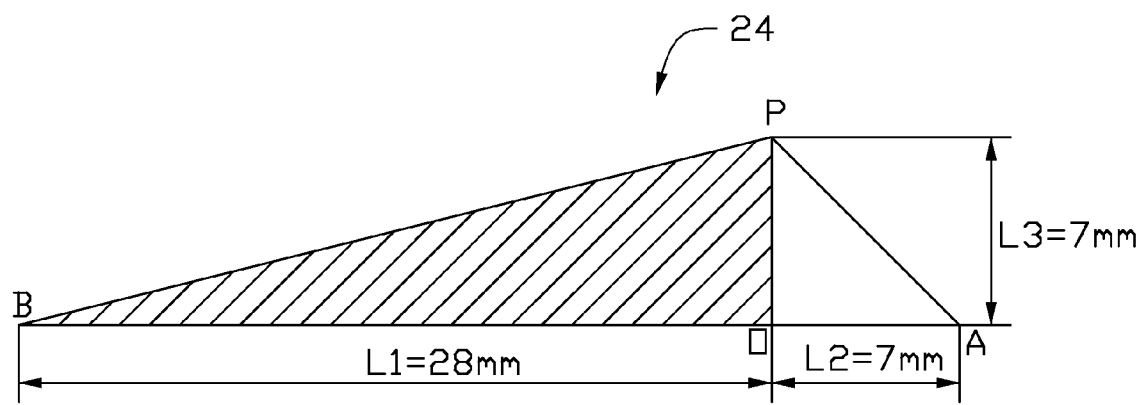
FIG. 9 is a schematic diagram of each of a plurality of connecting parts of FIG. 7, showing a size and a shape of the connecting part, and showing two status of the connecting part before and after being rotated.
Figure 9:
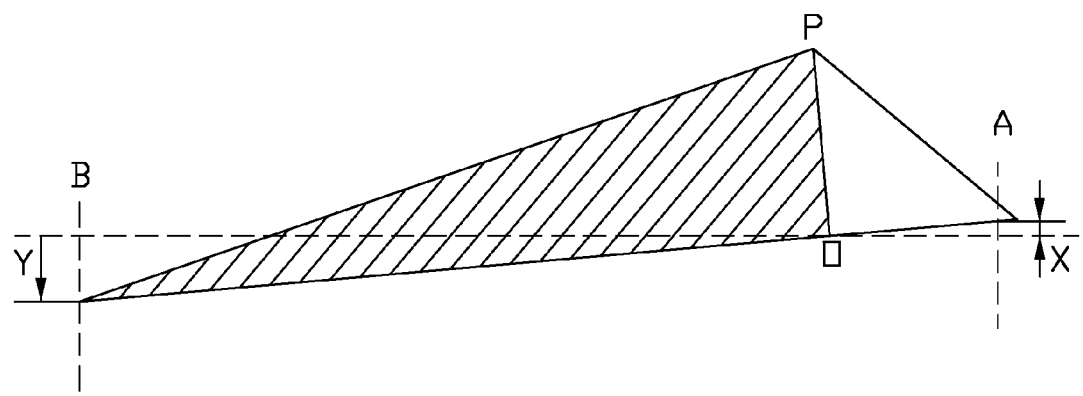

FIGS. 7-9 illustrate how the heat magnifying device 20 drives the movable board 10 to slide.

With reference to FIG. 8, according to thermodynamics, if a length of a metal bar is L, a thermal expansion coefficient of the metal bar is α, when a temperature of the metal bar rises from T1 degrees to T2 degrees, an elongation ΔL of the metal bar likes ΔL=L*α*(T1−T2) that named as a first formula.

With reference to FIG. 9, in the embodiment, the first positioning portion 241, the second positioning portion 242 and the pivoting portion 243 of each of the plurality of connecting parts 24 are collectively from a shape of triangle. The first positioning portion 241, the second positioning portion 242 and the pivoting portion 243 are respectively labeled as A, B, P, and a perpendicular intersection between the point P and the line AB is labeled as O. A length L1 of a line OB is assumed to be 28 mm, a length L2 of a line OA is assumed to be 7 mm, and a length L3 of a line OP is assumed to be 7 mm. If the point P is a rotating center of the connecting part 24, the relationship between a first displacement X of the connecting part 24 along a first axial (labeled as A) and a second displacement Y of the connecting parts 24 along a second axial (labeled as B) likes $$Y = \frac{X(56 - 3X)}{14 - 2X}$$

that named as a second formula.

With reference to FIG. 7, in the illustrated embodiment, the heat magnifying device 20 comprises four bars 23 respectively labeled as 23A, 23B, 23C, and 23D, and three connecting parts 24 link the four bars 23A, 23B, 23C, and 23D. Lengths of the four bars 23A, 23B, 23C, and 23D are respectively assumed to be 130 mm, 120 mm, 120 mm, and 160 mm. The four bars 23A, 23B, 23C, and 23D are made of aluminum, and a thermal expansion coefficient of the aluminum is $23*10^{-6}$ 1/degree Celsius.

If a temperature of the heat element 230 of the electronic device rises from 25 to 80 degrees Celsius, according to the lengths of the four bars 23A, 23B, 23C, 23D and the first formula, the elongations ΔL of the four bars 23A, 23B, 23C, 23D respectively equal to 0.16 mm, 0.15 mm, 0.15 mm, 0.22 mm. According to the calculated elongations ΔL of the four bars 23A, 23B, 23C, 23D and the second formula, displacements of the first positioning portions 241 and the second positioning portions 242 of the three connecting parts 24 are respectively 0.16 mm, 0.67 mm, 0.82 mm, 3.55 mm, 3.7 mm and 25.19 mm, as shown in FIG. 7. As a result, a displacement of the second end 232 of the bar 23D could be calculated to be 25.41 mm. That is, the displacement of the moving end 26 of the heat magnifying device 20 equals to 25.41 mm, which sufficiently drives the movable board 10 to slide relatively to the cover 210.

Figure 10:
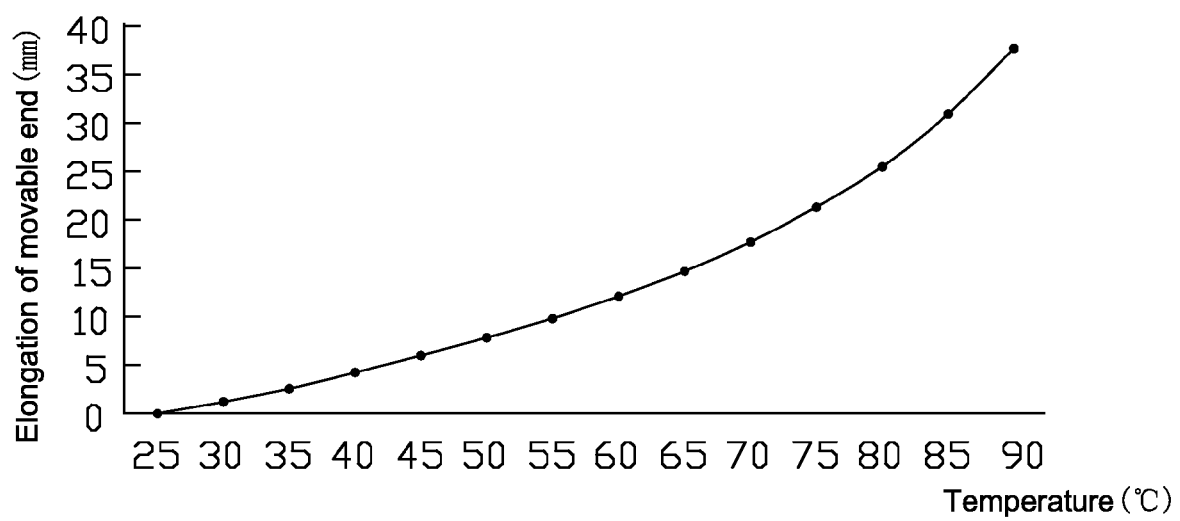
FIG. 10 is a graph showing an exemplary relationship between a temperature of a heat element within a cover of the electronic device of FIG. 1 and an elongated size of a moving end of the heat magnifying device of FIG. 6.

FIG. 10 is a graph showing an exemplary relationship between the temperature of the heat element 230 of the electronic device 200 and the elongation of the moving end 26 of the heat magnifying device 20.

Figure 11:
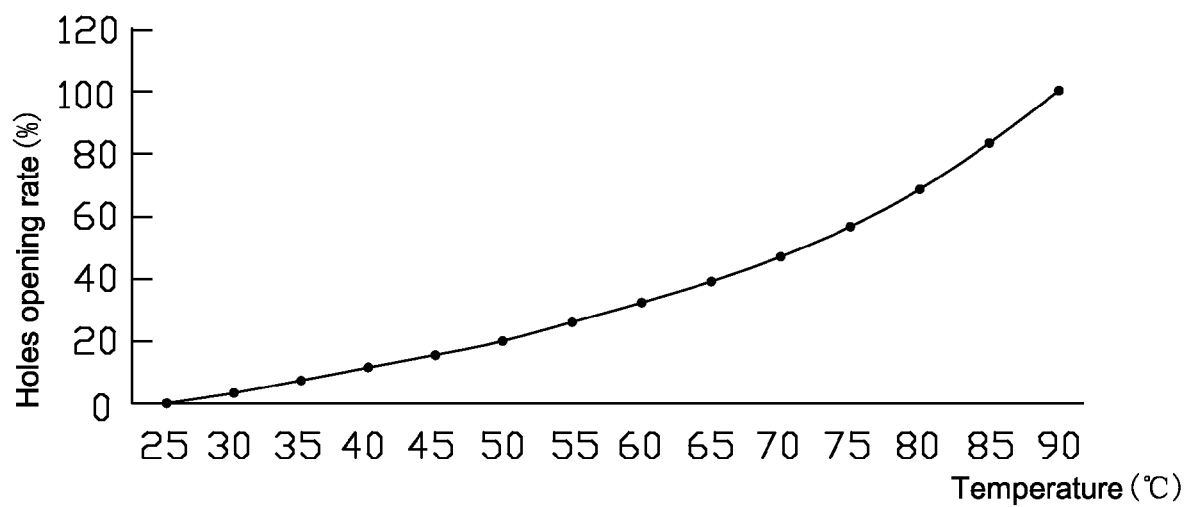
FIG. 11 is a graph showing an exemplary relationship between the temperature of the heat element and an opening rate of each of a plurality of first holes defined on a cover of the electronic device of FIG. 1.

FIG. 11 is a graph showing an exemplary relationship between the temperature of the heat element 230 of the electronic device 200 and an opening rate of the plurality of first holes 2101 of the cover 210 of the electronic device 200.

The electronic device 200 of the disclosure is capable of not only dissipating heat generated by the heat element 230, but also preventing dust from entering inside the electronic device 200 by making use of the principles of thermodynamics, instead of an external energy source, which is more Earth friendly.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:

1. A heat dissipating assembly configured in an electronic device comprising a cover defining a plurality of first holes and a heat element received inside the cover, the heat dissipating assembly comprising:
   a movable board comprising a plurality of second holes, and slidably connected to the cover; and
   a heat magnifying device received in the cover and adjacent to the heat element, the heat magnifying device comprising a moving end secured to the movable board;
   wherein when the heat element is maintained at room temperature, the plurality of first holes of the cover and the plurality of second holes of the movable board are staggered from each other;
   wherein heat generated by the heat element heats the heat magnifying device and causes the moving end of the heat magnifying device to move under thermal expansion and drive the movable board to slide relatively to the cover such that the plurality of first holes of the cover and the plurality of second holes of the movable board are communicated with each other.

2. The heat dissipating assembly of claim 1, wherein the heat magnifying device comprises a case fixed with the cover and defining a connecting hole, and a thermal pad received in the connecting hole and abutting the heat element.

3. The heat dissipating assembly of claim 1, wherein the heat device comprises a plurality of bars comprising a primary bar, a terminal bar, and secondary bars, wherein the secondary bars link the primary bar with the terminal bars, each of the plurality of bars comprises a first end and a second end, the first end of the primary bar is fixed with the cover, the second end of the terminal bar is exposed out of the case and formed as the moving end of the heat magnifying device.

4. The heat dissipating assembly of claim 3, wherein the heat device comprises a plurality of connecting parts, each of the plurality of connecting parts movably connected between each two adjacent bars of the plurality of bars.

5. The heat dissipating assembly of claim 4, wherein each of the plurality of connecting parts comprises a pivot portion adjacent to the second end of one of corresponding two adjacent bars and pivotally connected to the cover.

6. The heat dissipating assembly of claim 3, wherein the plurality of bars are stacked inside the cover.

7. The heat dissipating assembly of claim 6, wherein each of the plurality of bars defines at least one positioning hole, the at least one positioning hole of the stacked bars is communicate with each other to form a sliding groove, and wherein the cover comprises at least one positioning post received in the sliding groove and capable of sliding along the sliding groove.

8. An electronic device comprising a cover comprising a plurality of first holes, a heat element received inside the cover, and a heat dissipating assembly, the heat dissipating assembly comprising:
   a movable board comprising a plurality of second holes, and slidably connected to the cover; and
   a heat magnifying device received in the cover and adjacent to the heat element, the heat magnifying device comprising a moving end secured to the movable board;
   wherein when the heat element is maintained at room temperature, the plurality of first holes of the cover and the plurality of second holes of the movable board are staggered from each other;
   wherein heat generated by the heat element heats the heat magnifying device and causes the moving end of the heat magnifying device to move under thermal expansion and drive the movable board to slide relatively to the cover such that the plurality of first holes of the cover and the plurality of second holes of the movable board are communicated with each other.

9. The electronic device of claim 8, wherein the heat magnifying device comprises a case fixed with the cover and defining a connecting hole, and a thermal pad received in the connecting hole and abutting the heat element.

10. The electronic device of claim 8, wherein the heat device comprises a plurality of bars comprising a primary bar, a terminal bar, and secondary bars, wherein the secondary bars link the primary bar with the terminal bars, each of the plurality of bars comprises a first end and a second end, the first end of the primary bar is fixed with the cover, the second end of the terminal bar is exposed out of the case and formed as the moving end of the heat magnifying device.

11. The electronic device of claim 10, wherein the heat device comprises a plurality of connecting parts, each of the plurality of connecting parts is movably connected between each two adjacent bars of the plurality of bars.

12. The electronic device of claim 11, wherein each of the plurality of connecting parts comprises a pivot portion adjacent to the second end of one of corresponding two adjacent bars and pivotally connected to the cover.

13. The electronic device of claim 10, wherein the plurality of bars are stacked inside the cover.

14. The electronic device of claim 13, wherein each of the plurality of bars defines at least one positioning hole, the at least one positioning hole of the stacked bars is communicate with each other to form a sliding groove, and wherein the cover comprises at least one positioning post received in the sliding groove and capable of sliding along the sliding groove.

* * * * *